(12) United States Patent
Laprade et al.

(10) Patent No.: US 7,991,082 B2
(45) Date of Patent: Aug. 2, 2011

(54) MAXIMUM A POSTERIORI PROBABILITY DECODER

(75) Inventors: Maria Laprade, Palm Bay, FL (US); Matthew C. Cobb, W. Melbourne, FL (US); Timothy F. Dyson, Melbourne, FL (US)

(73) Assignee: Harris Corporation, Melbourne, FL (US)

( * ) Notice: Subject to any disclaimer, the term of this patent is extended or adjusted under 35 U.S.C. 154(b) by 944 days.

(21) Appl. No.: 11/931,156

(22) Filed: Oct. 31, 2007

(65) Prior Publication Data

US 2009/0110125 A1    Apr. 30, 2009

(51) Int. Cl.
H03M 13/03    (2006.01)
(52) U.S. Cl. ......... 375/341; 375/262; 714/794; 714/796
(58) Field of Classification Search ................... 375/262, 375/341; 714/786, 792, 794–796
See application file for complete search history.

(56) References Cited

U.S. PATENT DOCUMENTS

| | | | |
|---|---|---|---|
| 6,029,264 A | 2/2000 | Kobayashi et al. | |
| 6,202,189 B1 | 3/2001 | Hinedi et al. | |
| 6,263,466 B1 | 7/2001 | Hinedi et al. | |
| 6,323,788 B1 | 11/2001 | Kim et al. | |
| 6,690,739 B1 | 2/2004 | Mui | |
| 6,775,800 B2 | 8/2004 | Edmonston et al. | |
| 6,789,218 B1 | 9/2004 | Edmonston et al. | |
| 6,983,412 B2 | 1/2006 | Fukumasa et al. | |
| 7,093,179 B2 | 8/2006 | Shea | |
| 7,200,798 B2 | 4/2007 | Bickerstaff | |
| 7,246,296 B2 | 7/2007 | Yokokawa et al. | |
| 7,302,621 B2 | 11/2007 | Edmonston et al. | |
| 7,673,213 B2 | 3/2010 | Chugg et al. | |
| 7,730,378 B2 | 6/2010 | Li et al. | |
| 7,770,087 B2 | 8/2010 | Laprade et al. | |
| 7,770,093 B2 | 8/2010 | Divsalar et al. | |
| 7,870,458 B2 | 1/2011 | Laprade et al. | |
| 2004/0225940 A1 * | 11/2004 | Kerr et al. | 714/752 |
| 2005/0229087 A1 | 10/2005 | Kim et al. | |
| 2007/0079223 A1 | 4/2007 | Mondin et al. | |
| 2008/0229171 A1 | 9/2008 | Laprade et al. | |
| 2010/0031122 A1 | 2/2010 | Laprade et al. | |

OTHER PUBLICATIONS

Benedetto et al., "A Soft-Input Soft-Output APP Module for Iterative Decoding of Concatenated Codes," IEEE Comm. Letters, vol. 1, No. 1, pp. 22-24 (1997).

(Continued)

*Primary Examiner* — David Lugo
(74) *Attorney, Agent, or Firm* — Fox Rothschild, LLP; Robert J. Sacco

(57) ABSTRACT

A method is provided for performing a MAP probability decoding of a sequence R(n) including N bits of encoded data. The method includes the steps of: (a) generating a sequence $r_n$ of sot-values by processing the sequence R(n); (b) performing a forward recursion by computing alpha values $\alpha_{S,SG}$ utilizing the soft-decision values; (c) performing a backward recursion by computing beta values $\beta_{S,SG}$ utilizing the soft-decision values; and (d) performing an extrinsic computation by computing probability values $p'_k$. The alpha values $\alpha_{S,SG}$ are relative log-likelihoods of an encoding process arriving at various states. The beta values $\beta_{S,SG}$ are relative log-likelihoods of the encoding process arriving at various states. The probability values $p'_k$ represent a set of probabilities indicating that each data bit of an input sequence $d_K$ had a value equal to zero or one. The sequence R(n) represents an encoded form of the input sequence $d_K$.

23 Claims, 10 Drawing Sheets

OTHER PUBLICATIONS

Benedetto et al., "Serial Concatenation of Interleaved Codes: Performance Analysis, Design, and Iterative Decoding," IEEE Transactions on Information Theory, Vo 44, No. 3, pp. 906-926 (1988).

Garello et al., "Computing the Free Distance of Turbo Codes and Serially Concatenated Codes with Interleavers: Algorithms and Applications," IEEE Jnl on Selected Areas in Communications, vol. 19, No. 5, pp. 800-812 (2001).

Bosco et al., "A New Algorithm for 'Hard' Iterative Decoding of Concatenated Codes," IEEE Transactions on Communications, vol. 51, No. 8, pp. 1229-1232 (2003).

Benedetto et al., "Serial Concatenation of Block and Convolutional Codes," Electronics Letters, vol. 32, No. 10, pp. 887-888 (1996).

Benedetto et al., "Iterative decoding of serially concatenated convolutional codes," Electronics Letters, vol. 32, No. 13, pp. 1186-1188 (1996).

Benedetto et al., "Concatenated codes with interleaver for digital transmission over mobile channels," IEEE International Conference on Communications, vol. 10, pp. 3026-3030 (2001).

Scanavino et al., "Convergance properties of iterative decoders working a bit and symbol level," Global Telecommunications Conference, IEEE vol. 2, No. 25-29, pp. 1037-1041 (2001).

Benedetto et al., "On the Design of Binary Serially Concatenated Convolutional Codes," Communication Theory Mini-Conference, pp. 32-36 (1999).

Benedetto et al., "Serial Concatenated Trellis Coded Modulation with Iterative Decoding," Proceedings, IEEE International Symposium on Information Theory, p. 8, (1997).

Benedetto et al., "Serial concatenation of Interleaved codes: performance analysis, design and iterative decoding," IEEE International Sumposium on Information Theory, p. 106 (1997).

Benedetto et al., "Serial concatenation of interleaved codes: analytical performance bounds," Global Telecommunications Conf., "Communications: The Key to Global Prosperity," vol. 1, pp. 106-110 (1996).

Chandran, "MAP Algorithm FAQ," found on the WWW at <<http://www.ittc.ku.edu/~rvc/projects/faq/map.htm>> printed on Feb. 5, 2007.

\* cited by examiner

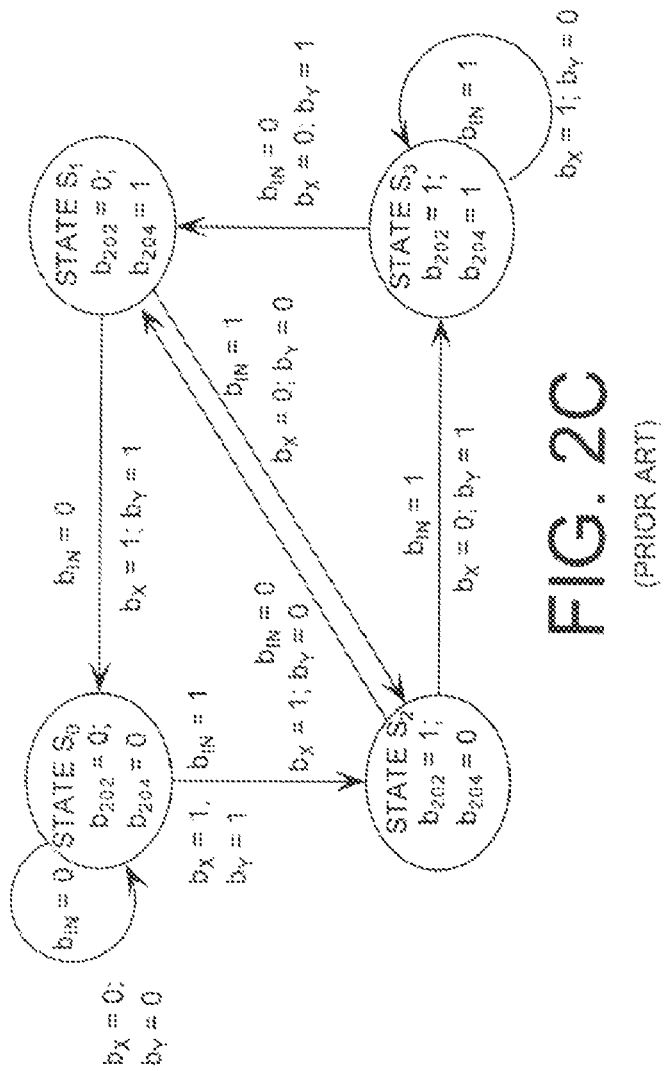

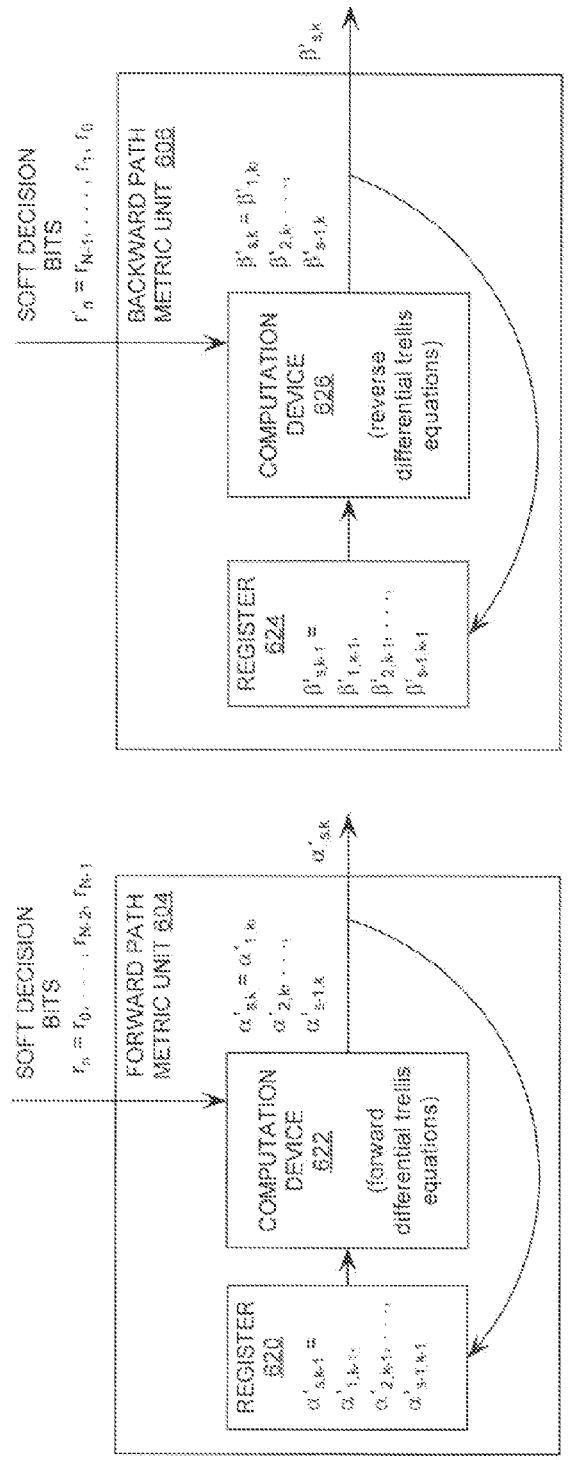
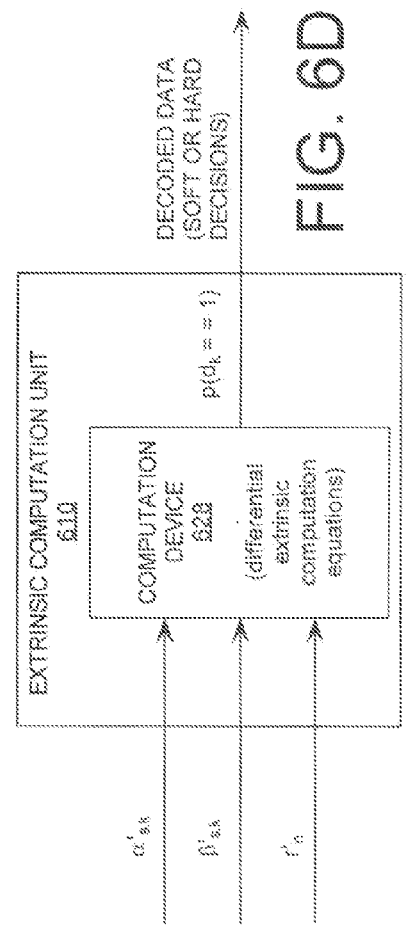
FIG. 6B
FIG. 6C
FIG. 6D

MAXIMUM A POSTERIORI PROBABILITY DECODER

BACKGROUND OF THE INVENTION

1. Statement of the Technical Field

The invention concerns communications systems comprising encoders and decoders. More particularly, the invention relates to maximum a posteriori decoders implementing an improved technique for performing maximum a posteriori probability decoding.

2. Description of the Related Art

Convolutional codes are commonly used in communications systems to reduce errors in transmission. Likewise, various decoding algorithms are known that can be used for decoding such convolutional codes at a data receiver. One such known type of decoding algorithm is the maximum a posteriori (MAP) decoder. Conventional MAP decoders are often comprised of a branch metric unit, a forward path metric unit, a backward path metric unit, a memory device and an extrinsic computation unit. The branch metric unit is generally configured to generate branch metric values for symbols contained in the received encoded information. The branch metric values are generated by calculating the likelihood that a symbol of the received encoded information resulted from each symbol in a code alphabet. The branch metric unit is also configured to perform this computation for each symbol of the received encoded information and alphabet symbol combination. The branch metric unit is further configured to communicate the branch metric values $M_0, M_1, \ldots, M_{N-1}$ to the memory device for temporary storage.

The forward path metric unit is configured to access the memory device and retrieve the branch metric values $M_0, M_1, \ldots, M_{N-1}$ from the memory device. Similarly, the backward path metric unit is configured to access the memory device and retrieve the branch metric values $M_{N-1}, M_{N-2}, \ldots, M_0$. It should be noted that each of the branch metric units is comprised of a normalization device. The normalization device is configured to normalize the branch metric values input into the respective branch metric unit. Normalization devices are well known to persons skilled in the art, and therefore will not be described in great detail herein. However, it should be understood that the term "normalize" as used herein refers to a scaling of a branch metric value by subtracting a constant value from the branch metric value. It should also be understood that the normalization is performed to: (a) ensure that the branch metric values fall within a pre-defined range of values; and (b) ensure that output of the path metric unit also falls within the quantization limits (i.e., a pre-defined range of values) of the MAP decoder implementation. Quantization limits are well known to persons skilled in the art, and therefore will not be described in great detail herein.

The path metric units are also configured to produce output probability values by consolidating the branch metric values along a constrained set of trellis paths. The output probability values represent the probability that the encoding process arrived at a given state during a given stage. The path metric units are also configured to communicate the output probability values to the memory device for temporary storage.

The extrinsic computation unit is coupled to the memory device. The extrinsic computation unit is configured to retrieve the branch metric values $M_0, M_1, \ldots, M_{N-1}$ and the output probability values from the memory device. The extrinsic computation unit is also configured to produce MAP output values by combining the branch metric values $M_0, M_1, \ldots, M_{N-1}$ and output probability values. The MAP output values include decoded information bits. Accordingly, the MAP output values are the same as or substantially similar to the information bits encoded by the encoder.

Despite the advantages of the above described MAP decoder, it suffers from certain drawbacks. For example, the MAP decoder is hardware intensive. In this regard, it should be noted that the branch metric units are comprised of normalization devices. The normalization devices are provided to maintain the outputs of the path metric units within the quantization limits of the MAP decoder implementation. It should also be noted that the MAP decoder requires a relatively large amount of memory to store the branch metric values $M_0, M_1, \ldots, M_{N-1}$ and output probability values.

In view of the forgoing, there is a need for a MAP decoder that is less hardware intensive than conventional MAP decoders. More specifically, there is a need for a MAP decoder that does not require normalization of the information input thereto. There is also a need for a MAP decoder that requires less memory resources as compared to conventional MAP decoders.

SUMMARY OF THE INVENTION

A method is provided for performing a maximum a posteriori probability decoding of a sequence R(n) including N bits of encoded data. The method includes the step of generating a sequence $r_n$ by processing the sequence R(n). The sequence $r_n$ includes a plurality of soft-decision values that comprise information about the N bits of encoded data. The method also includes a forward recursion step and a backward recursion step. The forward recursion step involves computing alpha values $\alpha'_{S,k+1}$ utilizing the soft-decision values. Each alpha value is a relative log-likelihood defined as the log-likelihood of an encoding process arriving at a given state $S_x$ during a stage k+1 relative to a log-likelihood of the encoding process arriving at another state $S_y$ during the stage k+1. The forward recursion step also involves computing the alpha values $\alpha'_{S,k+1}$ utilizing previously computed alpha values $\alpha'_{S,k}$. The forward recursion step further involves computing each alpha value utilizing at least one of the soft-decision values. Each soft-decision value is a log-likelihood of an output from an encoder having a value equal to one on a transition from a stage k to the stage k+1.

The backward recursion step involves computing beta values $\beta'_{S,k}$ utilizing the soft-decision values. Each beta value is a relative log-likelihood defined as a log-likelihood of the encoding process arriving at a given state $S_z$ during the stage k relative to a log-likelihood of the encoding process arriving at another state $S_w$ during the stage k. The backward recursion step also involves computing the beta values $\beta'_{S,k}$ utilizing previously computed beta values $\beta'_{S,k+1}$. The backward recursion step further involves computing each beta value utilizing at least one of the soft-decision values. Each soft-decision value is a log-likelihood of an output from an encoder having a value equal to one on a transition from a stage k to the stage k+1.

The method further includes the step of computing probability values $p'_k$ utilizing the alpha values $\alpha'_{S,k+1}$ and beta values $\beta'_{S,k}$. Each probability value indicates the likelihood that a data bit of an input sequence $d_K$ had a value equal to zero or one. It should be noted that the sequence R(n) represents an encoded form of the input sequence $d_K$. The method also involves determining data bit values for each data bit of the input sequence $d_K$ utilizing the probability values $p'_k$. Each data bit value is a hard decision bit value taken on the probability values $p'_k$.

A decoder is also provide for performing a maximum a posteriori probability decoding of a sequence R(n) including N bits of encoded data. The decoder is comprised of a forward path metric unit, a backward path metric unit and an extrinsic computation unit. The forward path metric unit is configured to receive soft-decision bits of a sequence $r_n$ in a pre-defined order. The forward path metric unit is also configured to compute alpha values $\alpha'_{S,k+1}$ utilizing the soft-decision bits. Each alpha value is a relative log-likelihood defined as a log-likelihood of an encoding process arriving at a given state $S_x$ during a stage k+1 relative to a log-likelihood of the encoding process arriving at another state $S_y$ during the stage k+1. The forward path metric unit is further configured to compute the alpha values $\alpha'_{S,k+1}$ utilizing previously computed alpha values $\alpha'_{S,k}$. The forward path metric unit is configured to compute each alpha value utilizing at least one of the soft-decision bits.

The backward path metric unit is configured to receive the soft-decision bits in a second order which is reverse from the pre-defined order. The backward path metric unit is also configured to compute beta values $\beta'_{S,k}$ utilizing the soft-decision bits. Each beta value is a relative log-likelihood defined as a log-likelihood of the encoding process arriving at a given state $S_z$ during a stage k relative to a log-likelihood of the encoding process arriving at another state $S_w$ during the stage k. The backward path metric unit is further configured to compute the beta values $\beta'_{S,k}$ utilizing previously computed beta values $\beta'_{S,k+1}$. The backward path metric unit is configured to compute each beta value utilizing at least one of the soft-decision bits.

The extrinsic computation unit is configured to compute $p'_k$ utilizing the alpha values $\alpha'_{S,k+1}$ and beta values $\beta'_{S,k}$. Each probability value indicates a probability that a data bit of an input sequence $d_K$ had a value equal to zero or one. The decoder is further comprised of a means configured for determining data bit values for each data bit of the input sequence $d_K$ utilizing the probability values $p'_k$. Each data bit value is a hard decision bit value taken on the probability values $p'_k$.

A machine-readable medium is further provided. The machine-readable medium has stored thereon instructions, which when executed by a machine, cause the machine to perform operations. The operations include generating a sequence $r_n$ by processing a sequence R(n) containing N bits of encoded data. The sequence $r_n$ includes soft-decision values that comprise information about the N bits of encoded data. The operations also include performing a forward recursion. The forward recursion involves computing alpha values $\alpha'_{S,k+1}$ utilizing the soft-decision values. Each alpha value is a relative log-likelihood defined as a log-likelihood of an encoding process arriving at a given state $S_x$ during a stage k+1 relative to a log-likelihood of the encoding process arriving at another state $S_y$ during a stage k+1. In this regard, it should be understood that the alpha values $\alpha'_{S,k+1}$ are computed utilizing previously computed alpha values $\alpha'_{S,k}$. It should also be understood that each alpha value is computed utilizing at least one of the soft-decision values.

The operations further include of performing a backward recursion. The backward recursion involves computing beta values $\beta'_{S,k}$ utilizing the soft-decision values. Each beta value is a relative log-likelihood defined as a log-likelihood of the encoding process arriving at a given state $S_z$ during a stage k relative to a log-likelihood of the encoding process arriving at another state $S_w$ during the stage k. In this regard, it should be understood that he beta values $\beta'_{S,k}$ are computed utilizing previously computed beta values $\beta'_{S,k+1}$. It should also be understood that each beta value is computed utilizing at least one of the soft-decision values.

According to an aspect of the invention, the operations also include performing an extrinsic computation. The extrinsic computation involves computing probability values $p'_k$ utilizing the alpha values $\alpha'_{S,k+1}$ and beta values $\beta'_{S,k}$. Each probability value indicates a probability that a data bit of an input sequence $d_K$ had a value equal to zero or one. The operations further include determining data bit values for each data bit of the input sequence $d_K$ utilizing the probability values $p'_k$. Each data bit value is a hard decision bit value.

BRIEF DESCRIPTION OF THE DRAWINGS

Embodiments will be described with reference to the following drawing figures, in which like numerals represent like items throughout the figures, and in which:

FIG. 2B is a table illustrating the operation conditions and associated output values of the conventional convolutional encoder shown in FIG. 2A that is useful for understanding the present invention.

FIG. 2C is a state diagram for the conventional convolutional encoder shown in FIG. 2A that is useful for understanding the present invention.

FIG. 6B is a detailed block diagram of the forward path metric unit of FIG. 6A that is useful for understanding the present invention.

FIG. 6C is a detailed block diagram of the backward path metric unit of FIG. 6A that is useful for understanding the present invention.

FIG. 6D is a detailed block diagram of the extrinsic computation unit of FIG. 6A that is useful for understanding the present invention.

DETAILED DESCRIPTION OF THE PREFERRED EMBODIMENTS

The present invention is for maximum a posteriori (MAP) decoders. Conventional MAP decoders compute a log-likelihood that an encoding process arrived at a given state of a trellis during a particular stage (or cycle). In contrast, the MAP decoder of the present invention computes only the relative log-likelihoods of arriving at various states of a trellis. These relative log-likelihood computations eliminate the need to normalize recursive calculations within the MAP decoder. These relative log-likelihood computations also reduce the amount of memory required by the MAP decoder during a decoding process. These features of the MAP decoder will become more evident as the discussion progresses.

The invention will now be described more fully hereinafter with reference to accompanying drawings, in which illustrative embodiments of the invention are shown. This invention, may however, be embodied in many different forms and should not be construed as limited to the embodiments set forth herein. For example, the present invention can be embodied as a method, a data processing system or a computer program product. Accordingly, the present invention can take the form as an entirely hardware embodiment, an entirely software embodiment or a hardware/software embodiment.

Figure 1:
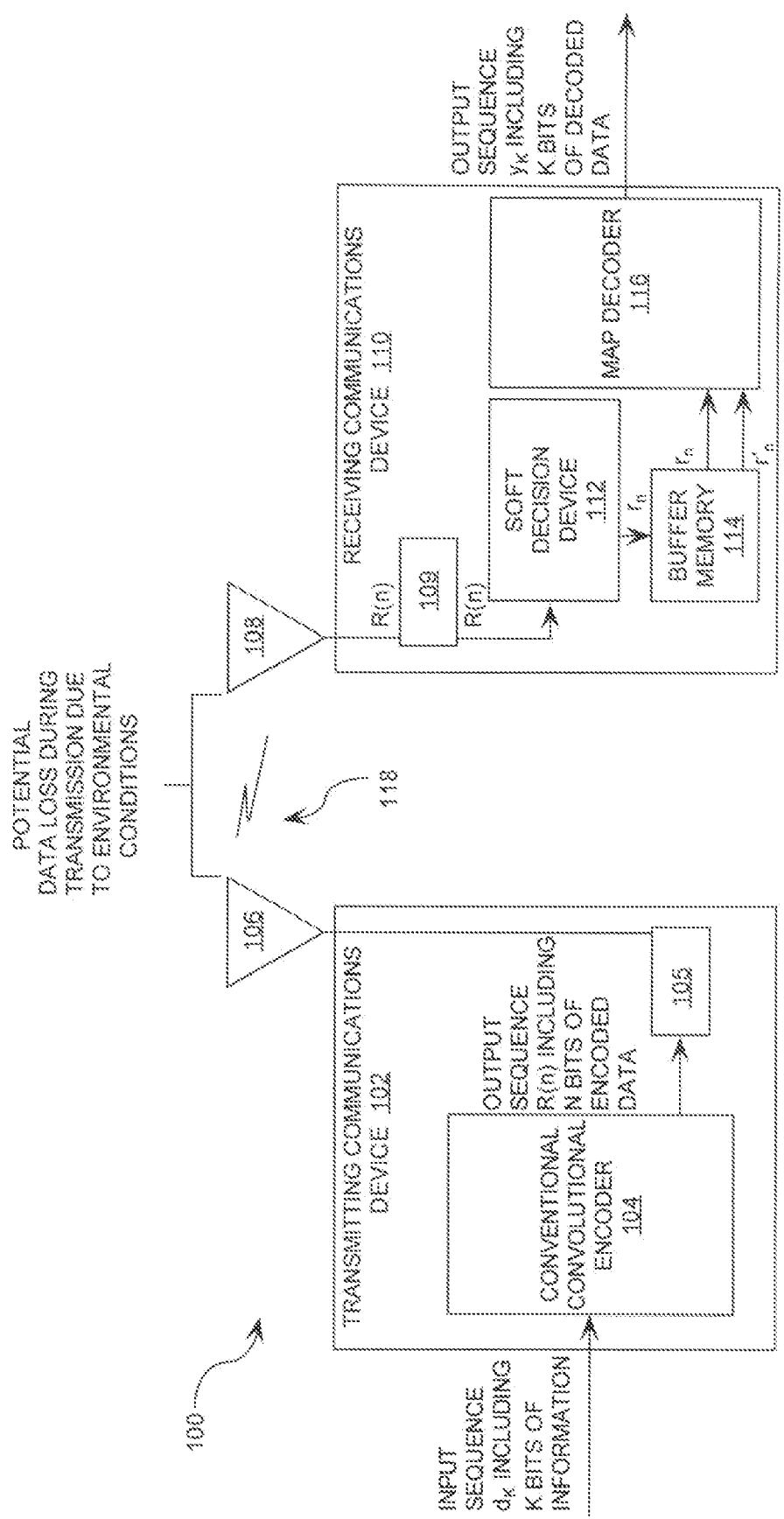
FIG. 1 is a block diagram of a communications system that is useful for understanding the present invention.

Referring now to FIG. 1, there is provided a block diagram of a communications system 100 that is useful for understanding the present invention. The communications system 100 is comprised of a transmitting communications device (TCD) 102 and a receiving communications device (RCD) 110. The TCD 102 includes a conventional convolutional encoder (CCE) 104 coupled to an RF transmitter 105, and an antenna 106 for facilitating an RF communication link. Each of the listed components 104, 105, 106 is well known to persons skilled in the art, and therefore will not be described in great detail herein.

The CCE 104 is configured to receive an input sequence $d_K$ from an external device (not shown). The input sequence $d_K$ contains K bits of information. The information can include payload data, such as voice data, video data, user identification data, signature data and/or the like. The CCE 104 is also configured to generate an output sequence R(n) by performing an encoding process utilizing the input sequence $d_K$. The output sequence R(n) contains N bits of encoded data, where N is greater than K. The CCE 104 is further configured to communicate the output sequence R(n) to the transmitter 105. Transmitter 105 uses the output sequence R(n) to modulate a carrier signal which is subsequently broadcast using antenna 106. The broadcasted signal from antenna 106 is communicated to RCD 110 via a communications link 118. The CCE 104 will be described in greater detail below in relation to FIGS. 2A-2E.

Encoding processes are well known to persons skilled in the art, and therefore will not be described in great detail herein. However, it should be appreciated that the encoding process is performed to incorporate redundancy (forward error correction) into the input sequence $d_K$. The phrase "forward error correction" as used herein refers to an error correction technique for data transmission. The error correction technique generally involves adding redundant data to the input sequence $d_K$ at the TCD 102 so that the RCD 110 can detect and correct errors in a received data transmission. The errors represent data corruption that occurred during a transmission due to environmental conditions.

Referring again to FIG. 1, the RCD 110 is comprised of an antenna 108 and a radio receiver 109 for receiving and demodulating the output sequence R(n) generated by the CCE 105. The RCD 110 is further comprised of a soft decision device (SDD) 112, a buffer memory 114 and a maximum a posteriori (MAP) decoder 116. Each of the listed components 108, 112, 114 is well known to persons skilled in the art, and therefore will not be described in great detail herein. The radio receiver 109 communicates the demodulated output sequence to the SDD 112.

The SDD 112 is configured to generate soft information by processing the received sequence R(n). The phrase "soft information" as used herein refers to a sequence $r_n$ including soft-decisions (which are represented by soft-decision values) that comprise information about the bits contained in the sequence R(n). In particular, soft-decision values are values that represent the probability that a particular bit in the sequence R(n) is either a one (1) or a zero (0). For example, a soft-decision value for a particular bit can indicate that the probability of a bit being a one (1) is p(1)=0.3. Conversely, the same bit can have a probability of being a zero (0) which is p(0)=0.7. The most commonly used soft values are log-likelihood ratios (LLR's). An LLR which is a positive value suggests that the bit is most likely to be a one (1) whereas a negative LLR suggests that the value of the bit is most likely a zero (0).

Referring again to FIG. 1, the SDD 112 is configured to communicate the soft-decision information (or soft-decision bits) to the buffer memory 114 for storage. The buffer memory 114 is coupled to the MAP decoder 116. The MAP decoder 116 provides a means for recovering information bits from the sequence R(n). In this regard, it should be understood that the MAP decoder 116 is configured to perform a MAP algorithm for decoding the coded sequence R(n). The MAP algorithm provides a method for determining the most probable information bits which were transmitted based on a noisy signal received over a communication link. It is known in the art that the MAP algorithm is a naturally Soft-Input, Soft-Output (SISO) algorithm. As such, the MAP decoder 116 is configured to access the buffer memory 114, retrieve the soft-decision information (or soft-decision bits) therefrom, and process the same to generate soft-decision information representing the probabilities that each data bit of the sequence $d_K$ had a value equal to one (1) or zero (0).

The MAP decoder 116 is further configured to convert the soft information to a sequence of hard decision bits. The phrase "hard decision bit" as used herein refers to a bit having a zero (0) value or a one (1) value. The sequence of hard decision bits represents the decoded sequence $y_K$. More particularly, the sequence of hard decision bits is the same as or substantially similar to the input sequence $d_K$. The MAP decoder 116 will be described in greater detail below in relation to FIG. 3 and FIGS. 5-6D.

Figure 2A:
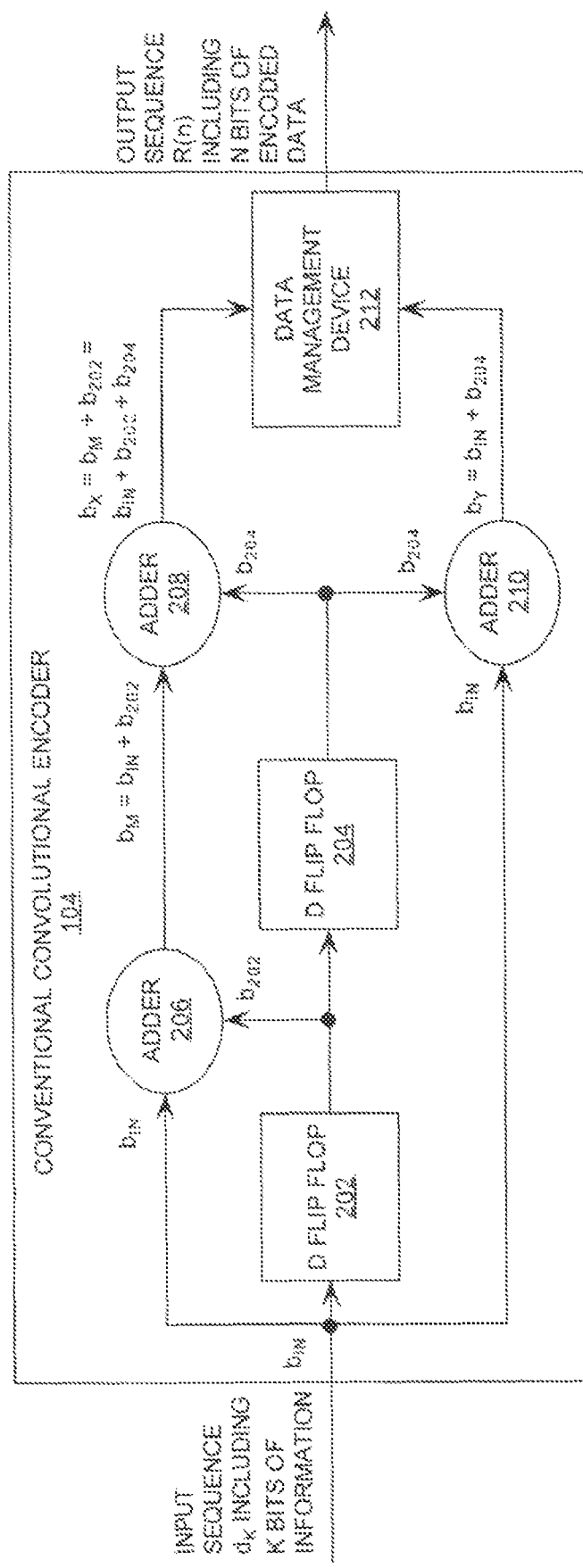
FIG. 2A is a detailed block diagram of the conventional convolutional encoder shown in FIG. 1 that is useful for understanding the present invention.

Referring now to FIG. 2A, there is provided an exemplary embodiment of the conventional convolutional encoder (CCE) 104 that is useful for understanding the present invention. As shown in FIG. 2A, the CCE 104 can be comprised of d flip-flops (DFFs) 202, 204, adders 206, 208, 210 and a data management device (DMD) 212. Each of the listed components 202, . . . , 212 is well known to persons skilled in the art, and therefore will not be described in great detail herein. However, a brief description of the CCE 104 is provided to assist a reader in understanding its operation.

Referring again to FIG. 2A, the DFFs 202, 204 are connected in series with a common clock (not shown). The CCE 104 is configured to receive bits of information from an external device (not shown). More particularly, a bit of information is received at the CCE 104 and passed through the DFFs 202, 204 in three (3) clock cycles. For example, a bit $b_{IN}$ is received at the CCE 104 during a first clock cycle. The bit $b_{IN}$ is passed through the DFF 202 during a second clock cycle. The bit $b_{202}$ output from the DFF 202 is passed through the DFF 204 during a third clock cycle.

The bits $b_X$, $b_Y$ output from the CCE 104 can have values defined by the following mathematical equations (1) and (2).

$$b_X = b_M + b_{202} = b_{IN} + b_{202} + b_{204} \quad (1)$$

$$b_Y = b_{IN} + b_{204} \quad (2)$$

where $b_{IN}$ is a bit of an input sequence $d_K$ received at the CCE 104, $b_M$ is a sum of the bits $b_{IN}$ and $b_{202}$, $b_{202}$ is a bit output from the DFF 202 during a second clock cycle, and $b_{204}$ is a bit output from the DFF 204 during a third clock cycle. It should be noted that two (2) bits $b_X$, $b_Y$ are output from the CCE 104 when a bit $b_{IN}$ is received at the CCE 104. As such, the sequence R(n) output from the CCE 104 includes twice the number of bits as contained in the input sequence $d_K$.

Referring now to FIG. 2B, there is provided a table illustrating the operating conditions and associated output values of the CCE 104. As shown in FIG. 2B, there are eight (8) operating conditions for the CCE 104. These operating conditions depend on the values of the bit $b_{IN}$ received at the CCE 104, the bit $b_{202}$ passed through the DFF 202, and the bit $b_{204}$ passed through the DFF 204. More particularly, the eight (8) operating conditions are respectively defined by the bits $b_{IN}$, $b_{202}$, $b_{204}$ where each bit has a zero (0) value or a one (1) value. For example, a first operating condition is defined by the bits $b_{202}$, $b_{204}$, $b_{IN}$ having respective values 0 0 0. A second operating condition is defined by the bits $b_{202}$, $b_{204}$, $b_{IN}$ having respective values 0 0 1. A third operating condition is defined by the bits $b_{202}$, $b_{204}$, $b_{IN}$ having respective values 0 1 0, and so on. Each operating condition has a defined pair of values for the output bits $b_X$, $b_Y$. For example, the first operating condition produces output bits $b_X$, $b_Y$ having values 0 0, respectively. Similarly, the second operating condition produces output bits $b_X$, $b_Y$ having values 1 1, respectively. Likewise, the third operating condition produces output bits $b_X$, $b_Y$ having respective values 1 1, and so on.

Referring now to FIG. 2C, there is provided a state diagram for the CCE 104. As shown in FIG. 2C, the CCE 104 has four (4) states $S_0$, $S_1$, $S_2$ and $S_3$. The states are defined by the values of the bits $b_{202}$, $b_{204}$. For example, a first state $S_0$ is defined by the bits $b_{202}$, $b_{204}$ having values 0 0. The second state $S_1$ is defined by the bits $b_{202}$, $b_{204}$ having values 0 1. The third state $S_2$ is defined by the bits $b_{202}$, $b_{204}$ having values 1 0. The fourth state $S_3$ is defined by the bits $b_{202}$, $b_{204}$ having values 1 1.

As shown in FIG. 2C, the CCE 104 remains in its current state or transitions from one state to another state each time it receives a bit $b_{IN}$. The state that the CCE 104 remains in or transitions to depends on: (a) the current state of the CCE 104; and (b) the value of the received bit $b_{IN}$. For example, if the CCE 104 is in a first state $S_0$ and the received bit $b_{IN}$ has a value equal to zero (0), then the CCE 104 remains in the first state $S_0$. The CCE 104 also outputs the bits $b_X$, $b_Y$ having values 0 0. Alternatively, if the CCE 104 is in a first state $S_0$ and the received bit $b_{IN}$ has a value equal to one (1), then the CCE 104 transitions to the third state $S_2$. The CCE 104 outputs the bits $b_X$, $b_Y$ having values 1 1. Likewise, if the CCE 104 is in a second state $S_1$ and the received bit $b_{IN}$ has a value equal to zero (0), then the CCE 104 transitions to the first state $S_0$. The CCE 104 outputs the bits $b_X$, $b_Y$ having values 1 1. Alternatively, if the CCE 104 is in the second state $S_1$ and the received bit $b_{IN}$ has a value equal to one (1), then the CCE 104 transitions to the third state $S_2$, and so on.

Figure 2D:
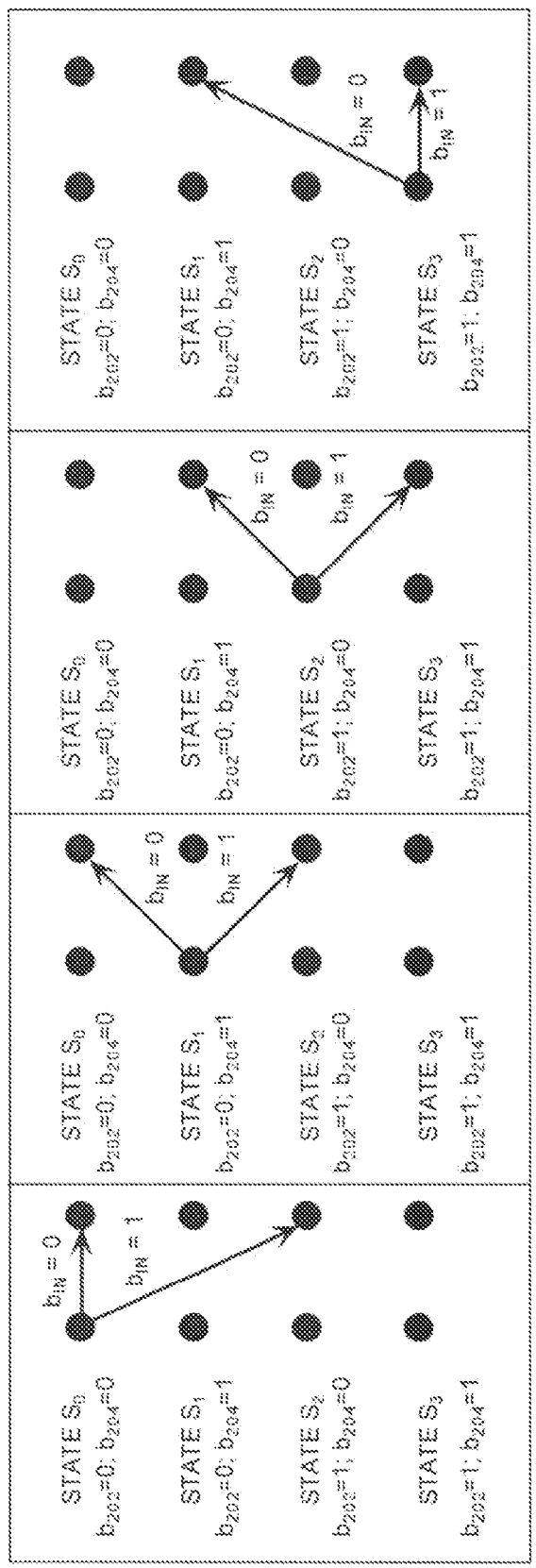
FIG. 2D is a trellis diagram showing the behavior of the conventional convolutional encoder shown in FIG. 2A that is useful for understanding the present invention.

Referring now to FIG. 2D, there is provided a schematic illustration of the possible transitions from each state $S_0$, $S_1$, $S_2$, $S_3$ when a bit $b_{IN}$ is received at the CCE 104. As shown in FIG. 2D, the CCE 104 transitions from the state $S_0$, $S_1$, $S_2$ to the state $S_2$, $S_2$, $S_3$ when the bit $b_{IN}$ has a value of one (1), respectively. Similarly, the CCE 104 transitions from the state $S_3$, $S_2$, $S_1$ to the state $S_1$, $S_1$, $S_0$ when the bit $b_{IN}$ has a value of zero (0), respectively. It should be noted that if the CCE 104 is in the first state $S_0$ and the bit has a value of zero (0) then the CCE 104 remains in the first state $S_0$. If the CCE 104 is in the fourth state $S_3$ and the bit has a value of one (1) then the CCE 104 remains in the fourth state $S_3$.

Figure 2E:
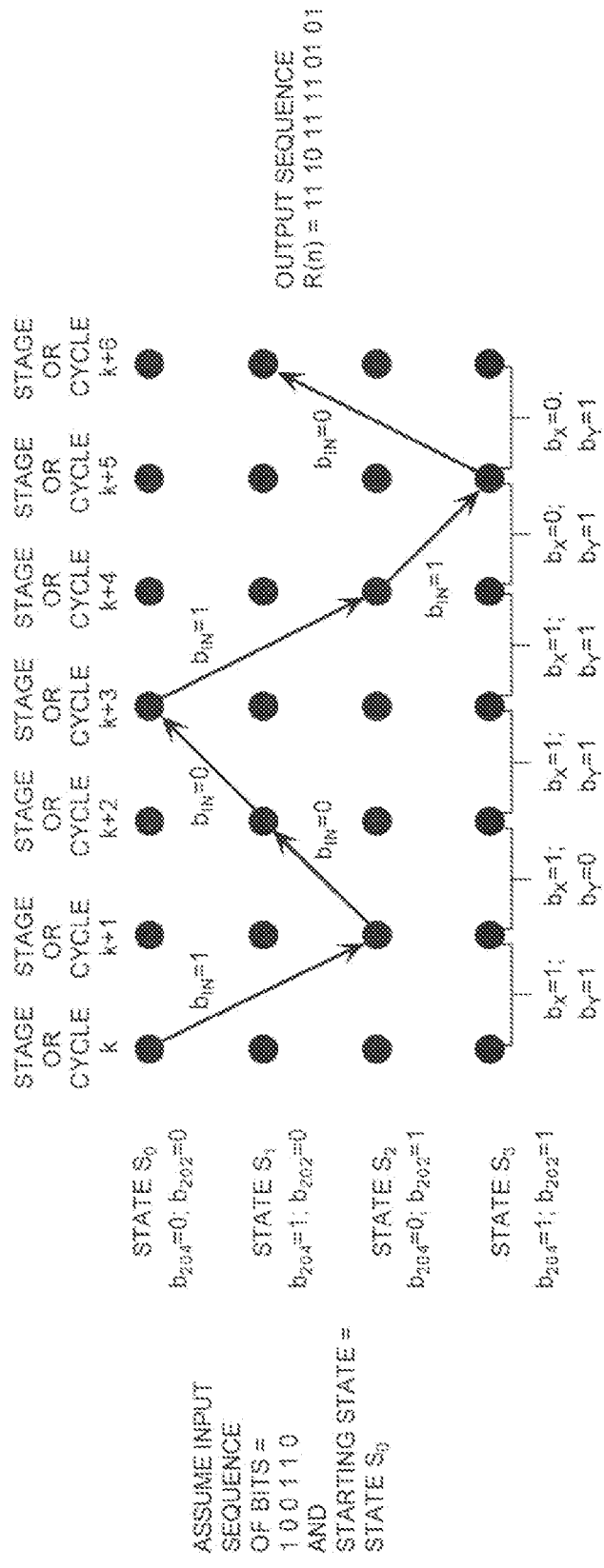
FIG. 2E is a trellis diagram showing an operation of the conventional convolutional encoder shown in FIG. 2A that is useful for understanding the present invention.

Referring now to FIG. 2E, there is provided an exemplary trellis diagram for the CCE 104. The trellis diagram illustrates an operation of the CCE 104 when an input sequence $d_K$ is defined as 1 0 0 1 1 0 and an initial state is defined as the first state $S_0$. As shown in FIG. 2E, the initial values for the bits $b_{202}$, $b_{204}$ equal 0 0. The value of the first bit $b_{IN}$ received at the CCE 104 equals one (1). As such, the CCE 104 transitions from the first state $S_0$ to the third state $S_2$. The CCE 104 also generates output bits $b_X$, $b_Y$ having values equal to 1 1. Thereafter, the CCE 104 receives a bit $b_{IN}$ having a value equal to zero (0). In effect, the CCE 104 transitions from the third state $S_2$ to the second state $S_1$. The CCE 104 also generates an output bit $b_X$ having a value equal to one (1) and an output bit $b_Y$ having a value equal to zero (0). Subsequently, the CCE 104 receives a bit $b_{IN}$ having a value equal to zero (0). As a result, the CCE 104 transitions from the second state $S_1$ to the first state $S_0$, and so on.

It should be noted that an output sequence R(n) of the CCE 102 describes a distinct path through a trellis diagram. As such, the bits input into the CCE 102 can be extracted from the trellis diagram by retracing the path shown in FIG. 2E. It should also be noted that error correction is possible because a bit of a transmitted sequence received at the RCD 110 (described above in relation to FIG. 1) can cause a detectable deviation from the distinct path through the trellis diagram. This deviation occurs from a bit having an error value resulting from environmental conditions encountered during signal transmission. However, the location in a sequence where a bit error exists may not be known in advance. As such, a MAP decoding process can be employed that uses the remaining bits of the sequence to reconstruct a most likely correct path through the trellis diagram. Generally, a MAP decoding process involves: (a) determining all possible paths through the trellis; and (b) selecting the path that has the fewest number of bit values which differ from the received bit values. A trellis diagram for a MAP decoder is provided in FIG. 3. A conventional MAP decoding process is described in great detail below in relation to FIG. 4. A MAP decoding process in accordance with the present invention is described in great detail below in relation to FIG. 5.

Figure 3:
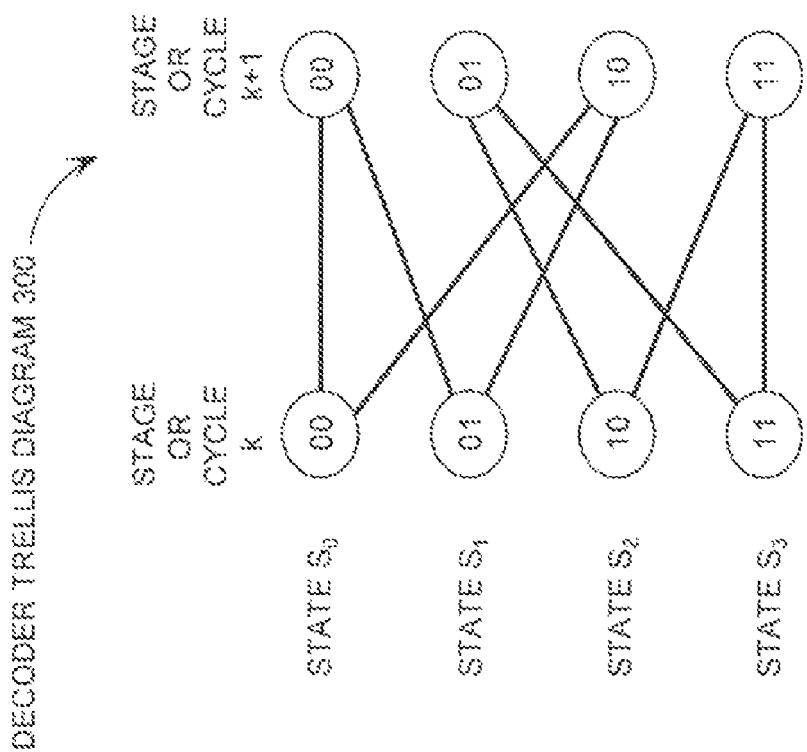
FIG. 3 is a trellis diagram representing the operation of the maximum a posteriori (MAP) decoder that is useful for understanding the present invention.

Referring now to FIG. 3, there is provided a trellis diagram 300 for a MAP decoder that is useful for understanding the operation of the same. It should be noted that a conventional MAP decoder performs computations to determine the log-likelihood that an encoding process arrived at a given state $S_0$, $S_1$, $S_2$, $S_3$ of the trellis 300 during a particular stage (or cycle) k, k+1. In contrast, the MAP decoder 116 (in accordance with the present invention) performs computations to determine the relative log-likelihood of an encoding process arriving at various states $S_0$, $S_1$, $S_2$, $S_3$. These functions of the conventional MAP decoder and the MAP decoder 116 will become more evident as the discussion progresses.

Figure 4:
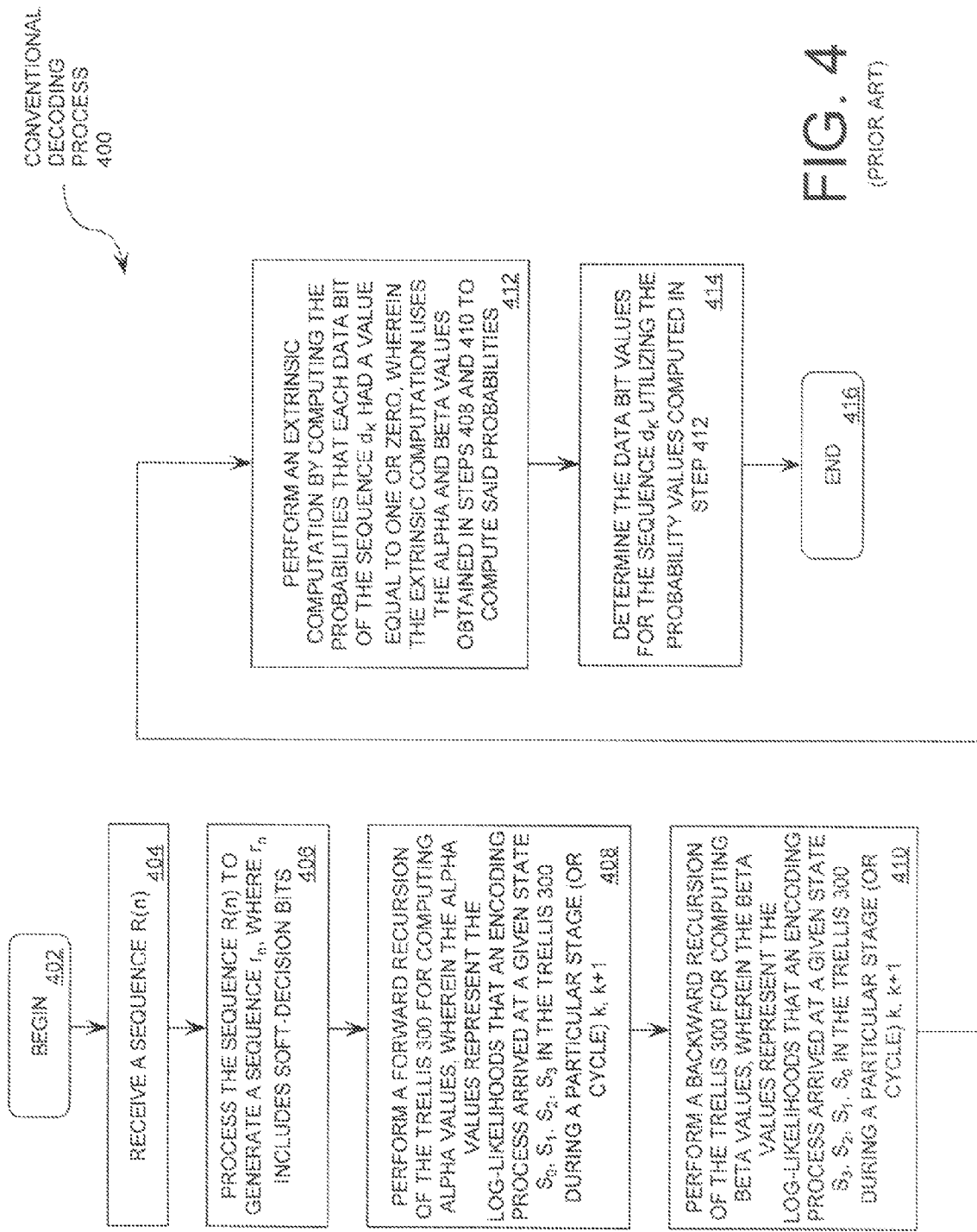
FIG. 4 is a flow diagram of a conventional MAP decoding process that is useful for understanding the present invention.

Referring now to FIG. 4, there is provided a flow diagram of a decoding process 400 for a conventional MAP decoder. As shown in FIG. 4, the conventional decoding process 400 begins at step 402 and continues to step 404. In step 404, a sequence R(n) is received at a conventional receiving communications device (RCD) similar to RCD 110 described in relation to FIG. 1. Subsequent to step 404, the conventional decoding process 400 continues with step 406. In step 406, a sequence $r_n$ is generated by processing the received sequence R(n). Notably, the sequence $r_n$ includes soft-decisions (which are represented by soft-decision values) that comprise information about the bits contained in the sequence R(n).

After step 406, the conventional decoding process 400 continues with step 408. In step 408, a forward recursion of the trellis 300 is performed. The forward recursion involves computing alpha values $\alpha_{S,k+1}$. The alpha values $\alpha_{S,k+1}$ represent the unnormalized log-likelihoods that an encoding process arrived at a given state $S_0$, $S_1$, $S_2$, $S_3$ of the trellis 300 during a stage (or cycle) k+1. The alpha values $\alpha_{S,k+1}$ can be defined by the following mathematical equations (3)-(6).

$$\alpha_{0,k+1} = \max(\alpha_{0,k}, \alpha_{1,k} + r_{2k} + r_{2k+1}) \quad (3)$$

$$\alpha_{1,k+1} = \max(\alpha_{2,k} + r_{2k}, \alpha_{3,k} + r_{2k+1}) \quad (4)$$

$$\alpha_{2,k+1} = \max(\alpha_{0,k} + r_{2k} + r_{2k+1}, \alpha_{1,k}) \quad (5)$$

$$\alpha_{3,k+1} = \max(\alpha_{2,k} + r_{2k+1}, \alpha_{3,k} + r_{2k}) \quad (6)$$

where $\alpha_{0,k}$ is the log-likelihood that an encoding process arrived at state $S_0$ of the trellis during a stage (or cycle) k. $\alpha_{1,k}$ is the log-likelihood that an encoding process arrived at state $S_1$ of the trellis during a stage (or cycle) k. $\alpha_{2,k}$ is the log-likelihood that an encoding process arrived at state $S_2$ of the trellis during a stage (or cycle) k. $\alpha_{3,k}$ is the log-likelihood that an encoding process arrived at state $S_3$ of the trellis during a stage (or cycle) k. $r_{2k}$ and $r_{2k+1}$ are soft-decision bits contained in the sequence $r_n$, where n is equal to two times k (n=2k). More particularly, $r_{2k}$ is the log-likelihood of an output $b_X$ from an encoder having a value of one (1) on the transition from a stage (or cycle) k to a stage (or cycle) k+1. $r_{2k+1}$ is the log-likelihood of an output $b_Y$ from an encoder having a value of one (1) on the transition from a stage (or cycle) k to a stage (or cycle) k+1. $\alpha_{0,k+1}$ is the log-likelihood that an encoding process arrived at state $S_0$ of the trellis during a stage (or cycle) k+1. $\alpha_{1,k+1}$ is the log-likelihood that an encoding process arrived at state $S_1$ of the trellis during a stage (or cycle) k+1. $\alpha_{2,k+1}$ is the log-likelihood that an encoding process arrived at state $S_2$ of the trellis during a stage (or cycle) k+1. $\alpha_{3,k+1}$ is the log-likelihood that an encoding process arrived at state $S_3$ of the trellis during a stage (or cycle) k+1.

Subsequent to computing the alpha values, step 410 is performed. In step 410, a backward recursion of the trellis 300 is performed. The backward recursion involves computing beta values $\beta_{S,k}$. The beta values $\beta_{S,k}$ represent the log-likelihoods that an encoding process arrived at a given state $S_0, S_1, S_2, S_3$ of the trellis 300 during a stage (or cycle) k. The beta values $\beta_{S,k}$ can be defined by the following mathematical equations (7)-(10).

$$\beta_{0,k} = \max(\beta_{0,k+1}, \beta_{2,k+1} + r_{2k} + r_{2k+1}) \quad (7)$$

$$\beta_{1,k} = \max(\beta_{0,k+1} + r_{2k} + r_{2k+1}, \beta_{2,k+1}) \quad (8)$$

$$\beta_{2,k} = \max(\beta_{1,k+1} + r_{2k}, \beta_{3,k+1} + r_{2k+1}) \quad (9)$$

$$\beta_{3,k} = \max(\beta_{1,k+1} + r_{2k+1}, \beta_{3,k+1} + r_{2k}) \quad (10)$$

where $\beta_{0,k+1}$ is the log-likelihood that an encoding process arrived at state $S_0$ of the trellis during a stage (or cycle) k+1. $\beta_{1,k+1}$ is the log-likelihood that an encoding process arrived at state $S_1$ of trellis during a stage (or cycle) k+1. $\beta_{2,k+1}$ is the log-likelihood that an encoding process arrived at state $S_2$ of the trellis during a stage (or cycle) k+1. $\beta_{3,k+1}$ is the log-likelihood that an encoding process arrived at state $S_3$ of the trellis during a stage (or cycle) k+1. $r_{2k}$ and $r_{2k+1}$ are soft-decision bits contained in the sequence $r_n$, where n is equal to two times k (n=2k). More particularly, $r_{2k}$ is the log-likelihood of an output $b_X$ from an encoder having a value equal to one (1) on the transition from a stage (or cycle) k to a stage (or cycle) k+1. $r_{2k+1}$ is the log-likelihood of an output by from an encoder having a value equal to one (1) on the transition from a stage (or cycle) k to a stage (or cycle) k+1. $\beta_{0,k}$ is the log-likelihood that an encoding process arrived at state $S_0$ of the trellis during a stage (or cycle) k. $\beta_{1,k}$ is the log-likelihood that an encoding process arrived at state $S_1$ of the trellis during a stage (or cycle) k. $\beta_{2,k}$ is the log-likelihood that an encoding process arrived at state $S_2$ of the trellis during a stage (or cycle) k. $\beta_{3,k}$ is the log-likelihood that an encoding process arrived at state $S_3$ of the trellis during a stage (or cycle) k.

After computing the alpha and beta values, the conventional decoding process 400 continues with step 412. In step 412, an extrinsic computation is performed. The extrinsic computation involves computing the probabilities that each data bit of the sequence $d_K$ has a value equal to one (1) or zero (0). It should be noted that the probability values are soft-decision values that comprise information about the data bits contained in the sequence $d_K$. The extrinsic computation uses the alpha and beta values obtained in steps 408, 410 for computing said probabilities.

The probability values can be defined by the mathematical equation (11).

$$p_k = \max(\alpha_{3,k+1} + \beta_{3,k}, \alpha_{2,k+1} + \beta_{2,k}) - \max(\alpha_{1,k+1} + \beta_{1,k}, \alpha_{0,k+1} + \beta_{0,k}) \quad (11)$$

where $\alpha_{0,k+1}$ is the log-likelihood that an encoding process arrived at state $S_0$ of the trellis during a stage (or cycle) k+1. $\alpha_{1,k+1}$ is the log-likelihood that an encoding process arrived at state $S_1$ of the trellis during a stage (or cycle) k+1. $\alpha_{2,k+1}$ is the log-likelihood that an encoding process arrived at state $S_2$ of the trellis during a stage (or cycle) k+1. $\alpha_{3,k+1}$ is the log-likelihood that an encoding process arrived at state $S_3$ of the trellis during a stage (or cycle) k+1. $\beta_{0,k}$ is the log-likelihood that an encoding process arrived at state $S_0$ of the trellis during a stage (or cycle) k. $\beta_{1,k}$ is the log-likelihood that an encoding process arrived at state $S_1$ of the trellis during a stage (or cycle) k. $\beta_{2,k}$ is the log-likelihood that an encoding process arrived at state $S_2$ of the trellis during a stage (or cycle) k. $\beta_{3,k}$ is the log-likelihood that an encoding process arrived at state $S_3$ of the trellis during a stage (or cycle) k.

In step 414, the data bit values for the sequence $d_K$ are determined utilizing the probability values $p_K$ computed in step 412. It should be noted that the data bit values are hard decision bits. Thereafter, step 414 is performed where the decoding process 400 ends.

Figure 5:
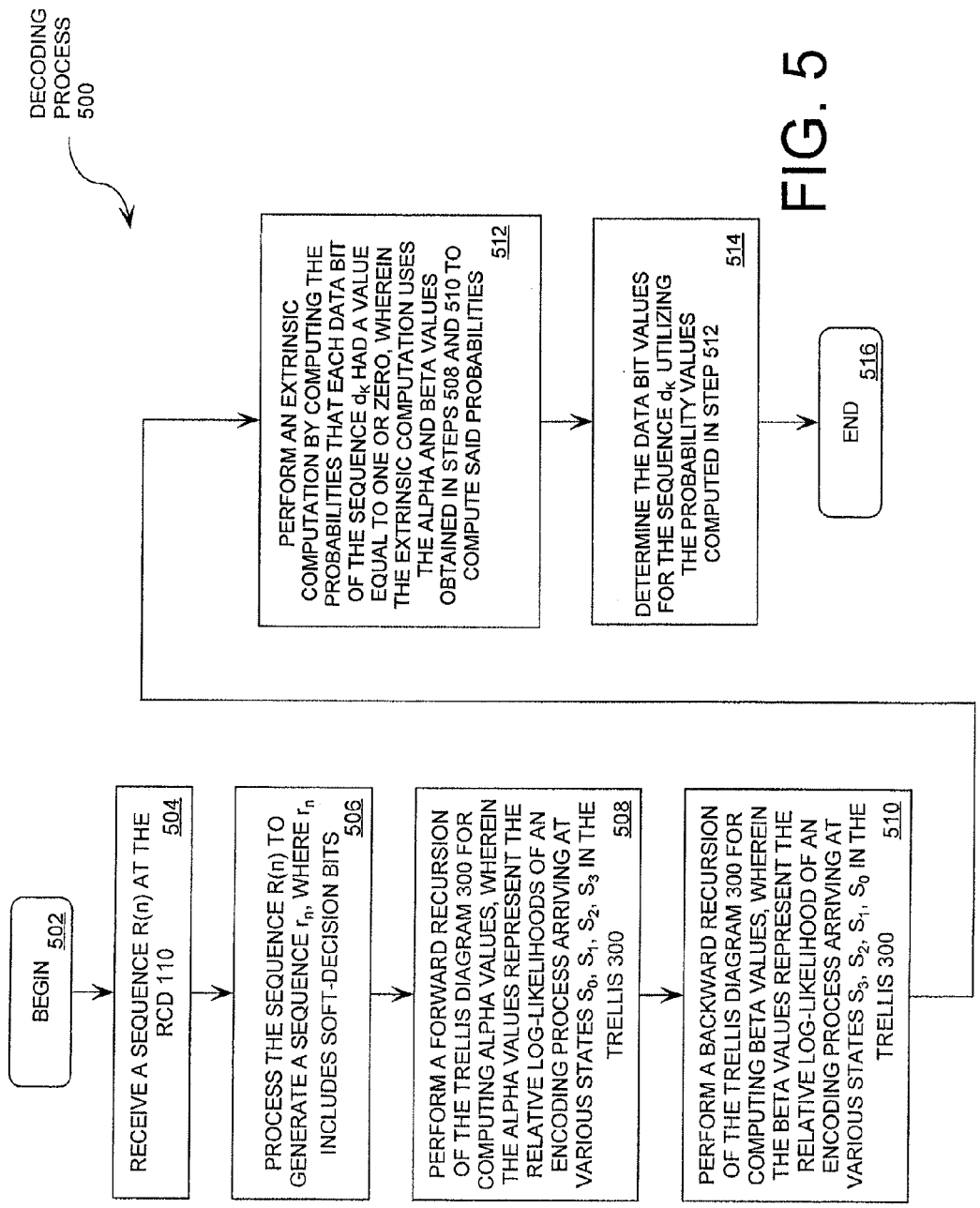
FIG. 5 is a flow diagram of a MAP decoding process that is useful for understanding the present invention.

Referring now to FIG. 5, there is provided a flow diagram of a decoding process 500 for the MAP decoder 116 (described above in relation to FIG. 1). As shown in FIG. 5, the decoding process 500 begins at step 502 and continues to step 504. In step 504, a sequence R(n) is received at the RCD 110 (described above in relation to FIG. 1). Subsequently, the decoding process 500 continues with step 506. In step 506, a sequence $r_n$ is generated by processing the received sequence R(n). Notably, the sequence $r_n$ includes soft-decisions (which are represented by soft-decision values) that comprise information about the bits contained in the sequence R(n).

After step 506, the decoding process 500 continues with step 508. In step 508, a forward recursion of the trellis 300 is performed. The forward recursion involves computing alpha values $\alpha'_{S,k+1}$. The alpha values $\alpha'_{S,k+1}$ represent the relative log-likelihoods of an encoding process arriving at various states $S_0, S_1, S_2$ of the trellis 300 during a stage (or cycle) k+1. The alpha values $\alpha'_{S,k+1}$ can be defined by the following mathematical equations (12)-(14).

$$\alpha'_{0,k+1} = \max(\alpha'_{0,k}, \alpha'_{1,k} + r_{2k} + r_{2k+1}) - \max(\alpha'_{2,k} + r_{2k+1}, r_{2k}) \quad (12)$$

$$\alpha'_{1,k+1} = \max(\alpha'_{2,k} + r_{2k}, r_{2k+1}) - \max(\alpha'_{2,k} + r_{2k+1}, r_{2k}) \quad (13)$$

$$\alpha'_{2,k+1} = \max(\alpha'_{0,k} + r_{2k} + r_{2k+1}, \alpha'_{1,k}) - \max(\alpha'_{2,k} + r_{2k+1}, r_{2k}) \quad (14)$$

where $\alpha'_{0,k}$ is a relative log-likelihood defined as the log-likelihood of an encoding process arriving at state $S_0$ during a stage (or cycle) k relative to the log-likelihood of the encoding process arriving at state $S_3$ during a stage (or cycle) k. $\alpha'_{1,k}$ is a relative log-likelihood defined as the log-likelihood of an encoding process arriving at state $S_1$ during a stage (or cycle) k relative to the log-likelihood of the encoding process arriving at state $S_3$ during a stage (or cycle) k. $\alpha'_{2,k}$ is a relative log-likelihood defined as the log-likelihood of an encoding process arriving at state $S_2$ during a stage (or cycle) k relative to the log-likelihood of the encoding process arriving at state $S_3$ during a stage (or cycle) k.

$r_{2k}$ and $r_{2k+1}$ are soft-decision bits contained in the sequence $r_n$, where n is equal to two times k (n=2k). More particularly, $r_{2k}$ is the log-likelihood of an output $b_X$ from the CCE 104 having a value equal to one (1) on the transition from a stage (or cycle) k to a stage (or cycle) k+1. $r_{2k+1}$ is the log-likelihood of an output $b_Y$ from the CCE 104 having a value equal to one (1) on the transition from a stage (or cycle) k to a stage (or cycle) k+1.

$\alpha'_{0,k+1}$ is a relative log-likelihood defined as the log-likelihood of an encoding process arriving at state $S_0$ during a stage (or cycle) k+1 relative to the log-likelihood of the encoding process arriving at state $S_3$ during a stage (or cycle) k+1. $\alpha'_{1,k+1}$ is a relative log-likelihood defined as the log-likelihood of an encoding process arriving at state $S_1$ during a stage (or cycle) k+1 relative to the log-likelihood of the encoding process arriving at state $S_3$ during a stage (or cycle) k+1. $\alpha'_{2,k+1}$ is a relative log-likelihood defined as the log-likelihood of an encoding process arriving at state $S_2$ during a stage (or cycle) k+1 relative to the log-likelihood of the encoding process arriving at state $S_3$ during a stage (or cycle) k+1.

Subsequent to computing the alpha values, step 510 is performed. In step 510, a backward recursion of the trellis 300 is performed. The backward recursion involves computing beta values $\beta'_{S,k}$. The $\beta'_{S,k}$ represent the relative log-likelihoods of an encoding process arriving at various states $S_0$, $S_2$, $S_3$ of the trellis 300 during a stage (or cycle) k. The beta values $\beta'_{S,k}$ can be defined by the following mathematical equations (15)-(17).

$$\beta'_{0,k}=\max(\beta'_{0,k+1},\beta'_{2,k+1}+r_{2k}+r_{2k+1})-\max(\beta'_{0,k+1}+r_{2k}+r_{2k+1},\beta'_{2,k+1}) \quad (15)$$

$$\beta'_{2,k}=\max(r_{2k},\beta'_{3,k+1}+r_{2k+1})-\max(\beta_{0,k+1}+r_{2k}+r_{2k+1},\beta'_{2,k+1}) \quad (16)$$

$$\beta'_{3,k}=\max(r_{2k+1},\beta'_{3,k+1}+r_{2k})-\max(\beta'_{0,k+1}+r_{2k}+r_{2k+1},\beta'_{2,k+1}) \quad (17)$$

where $\beta'_{0,k+1}$ is a relative log-likelihood defined as the log-likelihood of an encoding process arriving at state $S_0$ during a stage (or cycle) k+1 relative to the likelihood of the encoding process arriving at state $S_1$ during a stage (or cycle) k+1. $\beta'_{2,k+1}$ is a relative log-likelihood defined as the log-likelihood of an encoding process arriving at state $S_2$ during a stage (or cycle) k+1 relative to the likelihood of the encoding process arriving at state $S_1$ during a stage (or cycle) k+1. $\beta'_{3,k+1}$ is a relative log-likelihood defined as the log-likelihood of an encoding process arriving at state $S_3$ during a stage (or cycle) k+1 relative to the likelihood of the encoding process arriving at state $S_1$ during a stage (or cycle) k+1.

$r_{2k}$ and $r_{2k+1}$ are soft-decision bits contained in the sequence $r_n$, where n is equal to two times k (n=2k). More particularly, $r_{2k}$ is the log-likelihood of an output $b_X$ from the CCE 104 having a value equal to one (1) on the transition from stage (or cycle) k to a stage (or cycle) k+1. $r_{2k+1}$ is the log-likelihood of an output by from the CCE 104 having a value equal to one (1) on the transition from a stage (or cycle) k to a stage (or cycle) k+1.

$\beta'_{0,k}$ is a relative log-likelihood defined as the log-likelihood of an encoding process arriving at state $S_0$ during a stage (or cycle) k relative to the likelihood of the encoding process arriving at state $S_1$ during a stage (or cycle) k. $\beta'_{2,k}$ is a relative log-likelihood defined as the log-likelihood of an encoding process arriving at state $S_2$ during a stage (or cycle) k relative to the likelihood of the encoding process arriving at state $S_1$ during a stage (or cycle) k. $\beta'_{3,K}$ is a relative log-likelihood defined as the log-likelihood of an encoding process arriving at state $S_3$ during a stage (or cycle) k relative to the likelihood of the encoding process arriving at state $S_1$ during a stage (or cycle) k.

After computing the alpha and the beta values, the decoding process 500 continues with step 512. In step 512, an extrinsic computation is performed. The extrinsic computation involves computing the probabilities that each data bit of the sequence $d_K$ has a value equal to one (1) or zero (0). It should be noted that the probability values are soft-decision values that comprise information about the data bits contained in the sequence $d_K$. The extrinsic computation uses the alpha and beta values obtained in steps 508, 510 to compute said probabilities.

The probability values can be defined by the mathematical equation (18).

$$p'_k=\max(\beta'_{3,k},\alpha'_{2,k+1}+\beta'_{2,k})-\max(\alpha'_{1,k+1},\alpha'_{0,k+1}+\beta'_{0,k}) \quad (18)$$

Each of the variables $\alpha'_{0,k+1}$, $\alpha'_{1,K+1}$, $\alpha'_{2,K+1}$, $\beta'_{0,K}$, $\beta'_{2,K}$, $\beta'_{3,K}$ is defined above in relation to at least one of the mathematical equations (12)-(17).

In step 514, the data bit values for the sequence $d_K$ are determined utilizing the probability values $p'_k$ computed in step 512. It should be noted that the data bit values are hard decision bits. Thereafter, step 514 is performed where the decoding process 500 ends.

The following Example is provided in order to further illustrate the decoding processes 400, 500. The following Example is also provided in order to highlight the differences between the decoding processes 400, 500. The scope of the invention, however, is not to be considered limited in any way thereby.

Example 1

In this scenario, the CCE is selected as the CCE 104 shown in FIG. 2A. The description provided above in relation to FIGS. 2A-2E is sufficient for understanding the CCE of the present example. The data stream $d_K$ input into the CCE 104 is defined as 1 0 0 1 1 0 (as shown in FIG. 2E). Accordingly, the CCE 104 generates an output sequence R(n) defined as 11 10 11 11 01 01. If there is no corruption of the signal R(n), then the sequence $r_n$ of soft-decision bits can be defined as $r_{ideal}(n)$=7 7 7 −7 7 7 7 7 −7 7 −7 7. It should be noted that a positive seven (+7) is the highest assignable soft-decision value and negative seven (−7) is the lowest assignable soft-decision value. More particularly, a positive seven (+7) indicates a strong probability that a bit of the sequence R(n) has a value equal to one (1). A negative seven (−7) indicates a strong probability that a bit of the sequence R(n) has a value equal to zero (0).

Alternatively, if there is corruption of the signal R(n), the sequence $r_n$ will not be defined as $r_{ideal}(n)$. Rather, the sequence $r_n$ may be defined as the sequence $r_0(n)$=1 4 −1 −4 3 7 −2 3 −6 2 −5 1. A sequence $R_{hard}(n)$ including values for the sequence R(n) can be obtained utilizing the sequence $r_0(n)$. Accordingly, the sequence $R_{hard}(n)$ can be defined as the sequence $R_{hard}(n)$=1 1 0 0 1 1 0 1 0 1 0 1. As can be seen from the sequence $R_{hard}(n)$, the third and seventh value of the sequence $R_{hard}(n)$ are different from the third and seventh value of the sequence R(n). As such, the third and seventh values of the sequence R(n) have been corrupted and will need to be corrected by a decoding process.

As described above in relation to FIG. 2E, the sequence R(n) represents a defined path through a trellis for the CCE 104. A decoding process generally involves investigating the probability of taking various paths through the trellis utilizing the sequence $r_0(n)$. Let us assume that: (a) the CCE begins in an initial $S_0$; and (b) the initial alpha value $\alpha_0$ is a positive value.

In the conventional decoding process 400, a forward recursion process is performed utilizing the mathematical equations (3)-(6) (described above in relation to FIG. 4). A backward recursion process is also performed utilizing the mathematical equations (7)-(10) (described above in relation to FIG. 4). By solving the mathematical equations (3)-(6), the following alpha values are obtained: $\alpha_0$=15, 15, 15, 29, 29, 29, 29; $\alpha_1$=0, 4, 19, 23, 23, 30, 33; $\alpha_2$=0, 20, 10, 25, 30, 25, 30; and $\alpha_3$=0, 4, 16, 19, 28, 32, 27. By solving the mathematical equations (7)-(10), the following beta values are obtained: $\beta_0$=18, 15, 15, 4, 0, 0, 0; $\beta_1$=20, 11, 14, 3, 1, 0, 0; $\beta_2$=14, 13, 11, 5, 3, 1, 0; and $\beta_3$=15, 10, 10, 4, 2, 1, 0. It should be noted that the beta values are shown in an order reverse from the order in which they were computed. It should also be noted that the alpha and beta values gradually increase in the order of computation. This gradual numerical increase becomes a problem as the number of bits in the sequence R(n) increases. To resolve this problem, conventional MAP decoders include a normalization means for scaling the soft-decision bit values contained in the sequence $r_n$. This scaling is achieved by subtracting a constant value from the soft-decision bits values.

After obtaining the alpha values $\alpha_0$, $\alpha_1$, $\alpha_2$, $\alpha_3$ and beta values $\beta_0$, $\beta_1$, $\beta_2$, $\beta_3$, the same are substituted into the mathematical equation (11) (described above in relation to FIG. 4). By solving the mathematical equation (11), the following probability values are obtained: $p_k$=3, −7, −3, 4, 3, −3. A sequence $y_K$ including decoded bit values can be obtained by analyzing the probability values $p_k$. For example, if a positive probability value indicates a bit value of one (1) and a negative probability value indicates a bit value of zero (0), then the sequence $y_K$ can be defined as $y_K$=1 0 0 1 1 0. As can be seen from the sequence $y_K$, the third and seventh values of the sequence R(n) have been corrected by the decoding process 400.

In the decoding process 500 (described above in relation to FIG. 5), a forward recursion process is performed utilizing the mathematical equations (12)-(14) (described above in relation to FIG. 5). A backward recursion process is also performed utilizing the mathematical equations (15)-(17) (described above in relation to FIG. 5). By solving the mathematical equations (12)-(14), the following alpha values are obtained: $\alpha'_0$=7, 3, −1, 10, 1, −3, 2; $\alpha'_1$=0, 0, 3, 4, −5, −2, 6; and $\alpha'_2$=0, 8, −4, 6, 2, −7, 3. By solving the mathematical equations (15)-(17), the following beta values are obtained: $\beta'_0$=−2, 4, 1, 1, −1, 0, 0; $\beta'_2$=−6, 2, −3, 2, 2, 1, 0; and $\beta'_3$=−5, −1, −4, 1, 1, 1, 0. It should be noted that the beta values are shown in an order reverse from the order in which they were computed. It should also be noted that the alpha and beta values do not gradually increase in the order of computation. As such, the soft-decision bit values contained in the sequence $r_n$ do not need to be normalized.

After obtaining the alpha values $\alpha'_0$, $\alpha'_1$, $\alpha'_2$ and beta values $\beta'_0$, $\beta'_2$, $\beta'_3$, the same are substituted into the mathematical equation (18) (described above in relation to FIG. 5). By solving the mathematical equation (18), the following probability values are obtained: $p'_k$=3, −7, −3, 4, 3, −3. A sequence $y_K$ including decoded bit values can be obtained by analyzing the probability values $p'_k$. For example, if a positive probability value indicates a bit value of one (1) and a negative probability value indicates a bit value of zero (0), then the sequence $y_K$ can be defined as $y_K$=1 0 0 1 1 0. As can be seen from the sequence $y_K$, the third and seventh values of the sequence R(n) have been corrected by the decoding process 500.

It should be appreciated that the decoding process 500 obtained the same result as the conventional decoding process 400. However, the alpha and beta values generated in the decoding process 500 need not be normalized. It should also be appreciated the decoding process 500 requires less alpha and beta computations as compared to the conventional decoding process 400. As such, the decoding process 500 is less computationally intensive than the conventional decoding process 400. It should further be appreciated that if the decoding process 400, 500 is implemented in hardware then a memory device is needed to store at least one of the alpha values and the beta values for use in an extrinsic computation procedure. Since the conventional decoding process 400 computes more alpha and beta values than the decoding process 500, it will require a larger amount of memory resources as compared to the decoding process 500. Accordingly, a decoder implementing the decoding process 400 is more hardware intensive than a decoder implementing the decoding process 500.

Hardware Implementation

Figure 6A:
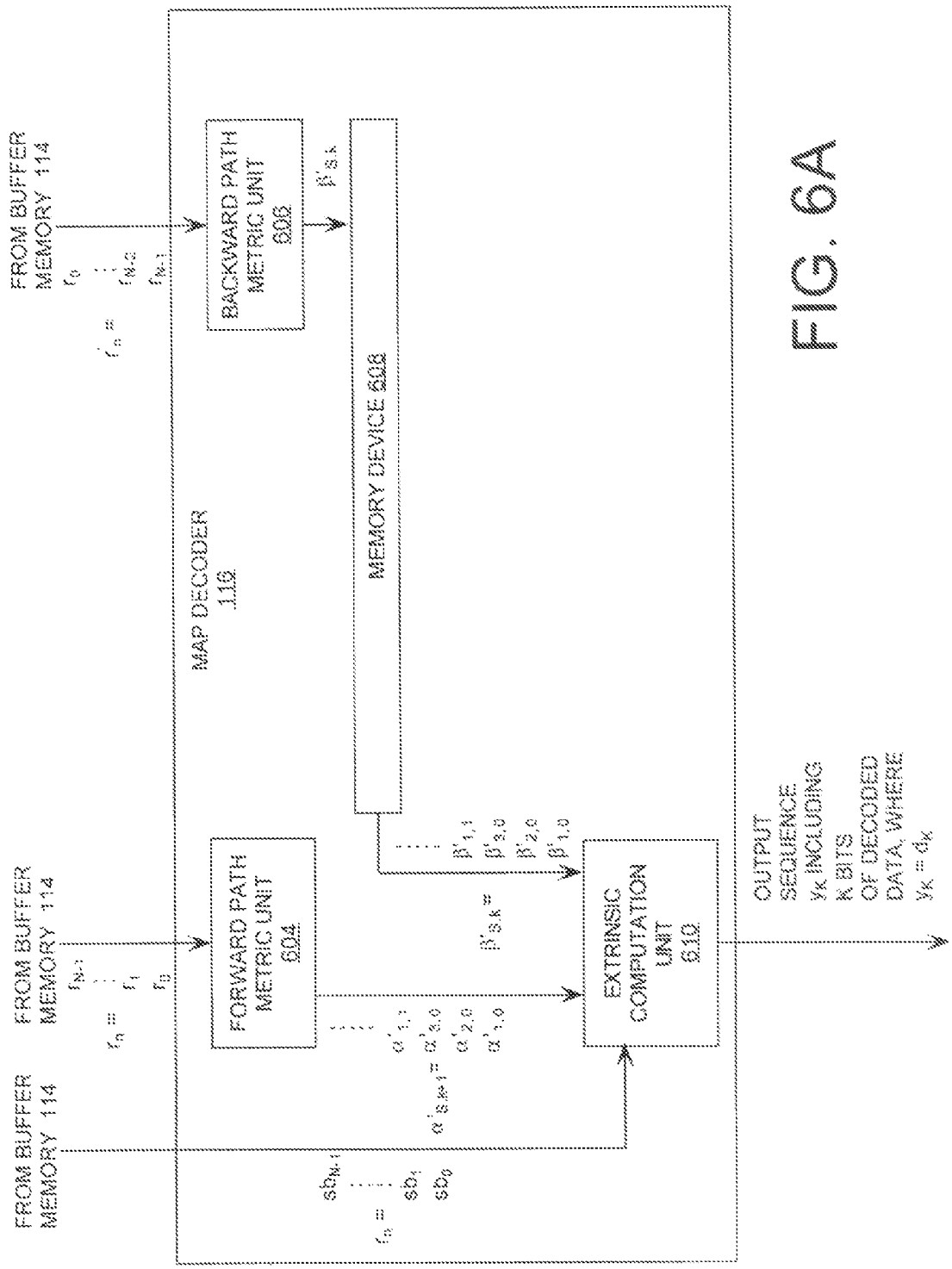
FIG. 6A is a detailed bock diagram of a MAP decoder implementing the MAP decoding process of FIG. 5 that is useful for understanding the present invention.

Referring now to FIG. 6A, there is provided a detailed block diagram of the MAP decoder 116 shown in FIG. 1. The MAP decoder 116 is generally configured to perform actions for retracing and/or reconstructing a distinct path through a trellis. More particularly, the MAP decoder 116 is configured to perform the decoding process described above in relation to FIG. 5 or a variation thereof. In this regard, it should be appreciated that the MAP decoder 116 is comprised of a forward path metric unit (FPMU) 604, a backward path metric unit (BPMU) 606, a memory device 608 and an extrinsic computation unit (ECU) 610. FPMUs, BPMUs and ECUs are well known to persons skilled in the art, and therefore will not be described in great detail herein. However, a brief discussion of the MAP decoder 116 architecture is provided to assist a reader in understanding the present invention.

Referring again to FIG. 6A, the BPMU 606 is coupled to the memory device 114 described above in relation to FIG. 1. The BPMU 606 is configured to access the memory device 114 and retrieve soft-decision bits stored therein. The soft-decision bits are contained in the sequence $r_n$. The soft-decision bits are retrieved from the memory device 114 in an order reverse to the order in which the soft-decision bits were written to the memory device 114 for storage. As such, the soft-decision bits are retrieved from the memory device 114 by the BPMU 606 in the following order $r_{N−1}$, $r_{N−2}$, . . . , $r_0$.

The BPMU 606 is also configured to perform a backward recursion of a trellis 300. The backward recursion involves computing beta values $\beta'_{S,k}$ representing the relative log-likelihood of an encoding process arriving at the various states $S_0$, $S_1$, $S_2$, $S_3$ of the trellis 300. The BPMU 606 is further configured to communicate the computed beta values $\beta'_{S,k}$ to the memory device 608 for temporary storage. The beta values $\beta'_{S,k}$ can be defined by the mathematical equations (15)-(17) described above in relation to FIG. 5. Still, the invention is not limited in this regard. For example, the beta values $\beta'_{S,k}$ can be defined by mathematical equations selected in accordance with a particular decoding application.

A more detailed block diagram of the BPMU 606 is provided in FIG. 6C. As shown in FIG. 6C, the BPMU 606 is comprised of a register 624 and a computation device 626.

The register 624 is provided to temporally store computed beta values for use in a subsequent backward recursion computation. The computation device 626 is comprised of hardware and/or software configured to perform beta computations utilizing the mathematical equations (15)-(17) and/or any other mathematical equations selected in accordance with a particular decoding application.

Referring again to FIG. 6A, the FPMU 604 is coupled to the memory device 114 (described above in relation to FIG. 1). The FPMU 604 is configured to access the memory device 114 and retrieve soft-decision bits stored therein. The soft-decision bits are contained in the sequence $r_n$. The soft-decision bits are retrieved from the memory device 114 in the same order in which the soft-decision bits were written to the memory device 114 for storage. As such, the soft-decision bits are retrieved from the memory device 114 in the following order $r_0, r_1, \ldots, r_{N-1}$.

The FPMU 304 is also configured to perform a forward recursion of the trellis 300. The forward recursion involves computing alpha values $\alpha'_{S,k+1}$ representing the relative log-likelihood of an encoding process arriving at various states $S_0, S_1, S_2, S_3$ of the trellis 300. The FPMU 304 is further configured to communicate the computed alpha values $\alpha'_{S,k+1}$ to the ECU 610. The alpha values $\alpha'_{S,k+1}$ can be defined by the mathematical equations (12)-(14) (described above in relation to FIG. 5). Still, the invention is not limited in this regard. For example, the alpha values $\alpha'_{S,k+1}$ can be defined by mathematical equations selected in accordance with a particular decoding application.

A more detailed block diagram of the FPMU 304 is provided in FIG. 6B. As shown in FIG. 6B, the FPMU 304 is comprised of a register 620 and a computation device 622. The register 620 is provided to temporally store computed alpha values $\alpha'_{S,k+1}$ for use in a subsequent forward recursion computation. The computation device 620 is comprised of hardware and/or software configured to perform alpha computations utilizing the mathematical equations (12)-(14) and/or any other mathematical equations selected in accordance with a particular decoding application.

Referring again to FIG. 6A, the ECU 610 is configured to access the memory device 608 and retrieve beta values $\beta'_{S,k}$ stored therein. The beta values $\beta'_{S,k}$ are retrieved in an order reverse to the order in which the beta values $\beta'_{S,k}$ were written to the memory device 608. As such, the beta values $\beta'_{S,k}$ are retrieved from the memory device 608 in the following order $\beta'_{1,0}, \beta'_{2,0}, \beta'_{3,0}, \ldots, \beta'_{1,N-1}$. The ECU 610 is also configured to perform an extrinsic computation. The extrinsic computation involves computing the probabilities that each data bit of the sequence $d_K$ had a value equal to one (1) or zero (0). It should be noted that the probability values $p'_k$ are soft-decision values that comprise information about the data bits contained in the sequence $d_K$. The extrinsic computation uses the received alpha and beta values for computing the probability values $p'_k$. The probability values $p'_k$ can be defined by the mathematical equation (18) described above in relation to FIG. 5. Still, the invention is not limited in this regard. For example, the probability values $p'_k$ can be defined by a mathematical equation selected in accordance with a particular decoding application.

The ECU 610 can further be configured to communicate the probability values $p'_k$ to an external device (not shown). However, it should be appreciated that the ECU 610 may be configured to determine the data bit values for the sequence $d_K$. This determination is made utilizing the probability values $p'_k$ previously computed. It should be noted that the data bit values are hard decision bits. In such a scenario, the ECU 610 may be configured to communicate a sequence $y_K$ including the hard decision bits to an external device (not shown).

A more detailed block diagram of the ECU 610 is provided in FIG. 6D. As shown in FIG. 6D, the ECU 610 is comprised of a computation device 628. The computation device 628 is comprised of hardware and/or software configured to compute the probability values $p'_k$ utilizing the mathematical equation (18) or any other mathematical equation selected in accordance with a particular decoding application.

A person skilled in the art will appreciate that the MAP decoder 116 of FIGS. 6A-6D provides one exemplary illustration of a MAP decoder architecture. However, the invention is not limited in this regard, and any other MAP decoder architecture can be used without limitation.

In light of the forgoing description of the invention, it should be recognized that the present invention can be realized in hardware, software, or a combination of hardware and software. A method for decoding an encoded sequence according to the present invention can be realized in a centralized fashion in one processing system, or in a distributed fashion where different elements are spread across several interconnected processing systems. Any kind of computer system, or other apparatus adapted for carrying out the methods described herein, is suited. A typical combination of hardware and software could be a general purpose computer processor, with a computer program that, when being loaded and executed, controls the computer processor such that it carries out the methods described herein. Of course, an application specific integrated circuit (ASIC), and/or a field programmable gate array (FPGA) could also be used to achieve a similar result.

The present invention can also be embedded in a computer program product, which comprises all the features enabling the implementation of the methods described herein, and which, when loaded in a computer system, is able to carry out these methods. Computer program or application in the present context means any expression, in any language, code or notation, of a set of instructions intended to cause a system having an information processing capability to perform a particular function either directly or after either or both of the following: (a) conversion to another language, code or notation; (b) reproduction in a different material form. Additionally, the description above is intended by way of example only and is not intended to limit the present invention in any way, except as set forth in the following claims.

All of the apparatus, methods and algorithms disclosed and claimed herein can be made and executed without undue experimentation in light of the present disclosure. While the invention has been described in terms of preferred embodiments, it will be apparent to those of skill in the art that variations may be applied to the apparatus, methods and sequence of steps of the method without departing from the concept, spirit and scope of the invention. More specifically, it will be apparent that certain components may be added to, combined with, or substituted for the components described herein while the same or similar results would be achieved. All such similar substitutes and modifications apparent to those skilled in the art are deemed to be within the spirit, scope and concept of the invention as defined.

We claim:

1. A method for performing a maximum a posteriori probability decoding of a sequence R(n) including N bits of encoded data, comprising:

utilizing a processing system to generate a sequence $r_n$ by processing said sequence R(n), said sequence $r_n$ including a plurality of soft-decision values that comprise information about said N bits of encoded data; and utilizing the processing system to perform a forward recursion by computing a plurality of alpha values $\alpha'_{S,k+1}$ utilizing said plurality of soft-decision values, each alpha value of said plurality of alpha values $\alpha'_{S,k+1}$ is a relative log-likelihood defined as a log-likelihood of an encoding process arriving at said given state $S_x$ during a stage k+1 relative to a log-likelihood of said encoding process arriving at another state $S_y$ during said stage k+1.

2. The method according to claim 1, wherein said performing a forward recursion step further involves computing said plurality of alpha values $\alpha'_{S,k+1}$ utilizing a plurality of previously computed alpha values $\alpha'_{S,k}$.

3. The method according to claim 2, wherein said performing a forward recursion step further involves computing each alpha value of said plurality of alpha values $\alpha'_{S,k+1}$ utilizing at least one soft-decision value of said plurality of soft-decision values.

4. The method according to claim 1, further comprising:
utilizing the processing system to perform a backward recursion by computing a plurality of beta values $\beta'_{S,k}$ utilizing said plurality of soft-decision values, each beta value of said plurality of beta values $\beta'_{S,k}$ is a relative log-likelihood defined as a log-likelihood of said encoding process arriving at a given state $S_z$ during a stage k relative to a log-likelihood of said encoding process arriving at another state $S_w$ during a stage k.

5. The method according to claim 4, wherein said performing a backward recursion step further involves computing said plurality of beta values $\beta'_{S,k}$ utilizing a plurality of previously computed beta values $\beta'_{S,k+1}$.

6. The method according to claim 5, wherein said performing a backward recursion step further involves computing each beta value of said plurality of beta values $\beta'_{S,k}$ utilizing at least one soft-decision value of said plurality of soft-decision values.

7. The method according to claim 4, further comprising utilizing the processing system determine a plurality of data bit values for each data bit of said data bit sequence by utilizing said plurality of probability values, wherein each data bit value of said plurality of data bit values is a hard decision bit value.

8. A decoder for performing a maximum a posteriori probability decoding of a sequence R(n) including N bits of encoded data, comprising:
a forward path metric unit comprising a computation device configured for: (a) receiving a plurality of soft-decision bits of a sequence $r_n$ in a pre-defined order; and (b) computing a plurality of alpha values $\alpha'_{S,k+1}$ utilizing said plurality of soft-decision bits, each alpha value of said plurality of alpha values $\alpha'_{S,k+1}$ is a relative log-likelihood defined as a log-likelihood of an encoding process arriving at said given state $S_x$ during a stage k+1 relative to a log-likelihood of said encoding process arriving at another state $S_y$ during a stage k+1.

9. The decoder according to claim 8, wherein said computation device is further configured for computing said plurality of alpha values $\alpha'_{S,k+1}$ utilizing a plurality of previously computed alpha values $\alpha'_{S,k}$.

10. The decoder according to claim 9, wherein said computation device is further configured for computing each alpha value of said plurality of alpha values $\alpha'_{S,k+1}$ utilizing at least one soft-decision bit of said plurality of soft-decision bits.

11. The decoder according to claim 8, further comprising a backward path metric unit configured for: (a) receiving said plurality of soft-decision bits in a second order which is reverse from said pre-defined order; and (b) computing a plurality of beta values $\beta'_{S,k}$ utilizing said plurality of soft-decision bits, each beta value of said plurality of beta values $\beta'_{S,k}$ is a relative log-likelihood defined as a log-likelihood of said encoding process arriving at a given state $S_z$ during a stage k relative to a log-likelihood of said encoding process arriving at another state $S_w$ during said stage k.

12. The decoder according to claim 11, wherein said backward path metric unit is further configured for computing said plurality of beta values $\beta'_{S,k}$ utilizing a plurality of previously computed beta values $\beta'_{S,k+1}$.

13. The decoder according to claim 12, wherein said backward path metric unit is further configured for computing each beta value of said plurality of beta values $\beta'_{S,k}$ utilizing at least one soft-decision bit of said plurality of soft-decision bits.

14. The decoder according to claim 11, further comprising an extrinsic computation unit configured for computing a plurality of probability values $p'_k$ utilizing said plurality of alpha values $\alpha'_{S,k+1}$ and said plurality of beta values $\beta'_{S,k}$, each probability value of said plurality of probability values $p'_k$ indicating a probability that a data bit of an input sequence $d_K$ had a value equal to zero or one, wherein said sequence R(n) represents an encoded form of said input sequence $d_K$.

15. The decoder according to claim 14, further comprising a means for determining a plurality of data bit values for each data bit of said input sequence $d_K$ utilizing said plurality of probability values $p'_k$, wherein each data bit value of said plurality of data bit values is a hard decision bit value.

16. A non-transitory machine-readable medium having stored thereon instructions, which when executed by a machine, cause the machine to perform the following operations comprising:
generating a sequence $r_n$ by processing a sequence R(n) containing N bits of encoded data, said sequence $r_n$ including a plurality of soft-decision values that comprise information about said N bits of encoded data; and
performing a forward recursion by computing a plurality of alpha values $\alpha'_{S,k+1}$ utilizing said plurality of soft-decision values, each alpha value of said plurality of alpha values $\alpha'_{S,k+1}$ is a relative log-likelihood defined as a log-likelihood of an encoding process arriving at a given state $S_x$ during a stage k+1 relative to a log-likelihood of said encoding process arriving at another state $S_y$ during said stage k+1.

17. The non-transitory machine-readable medium of claim 16, further comprising instructions to cause the operation of computing said plurality of alpha values $\alpha'_{S,k+1}$ utilizing a plurality of previously computed alpha values $\alpha'_{S,k}$.

18. The non-transitory machine-readable medium of claim 17, further comprising instructions to cause the operation of computing each alpha value of said plurality of alpha values $\alpha'_{S,k+1}$ utilizing at least one soft-decision value of said plurality of soft-decision values.

19. The non-transitory machine-readable medium of claim 16, further comprising instructions to cause the operation of performing a backward recursion by computing a plurality of beta values $\beta'_{S,k}$ utilizing said plurality of soft-decision values, each beta value of said plurality of beta values $\beta'_{S,k}$ is a relative log-likelihood defined as a log-likelihood of said encoding process arriving at a given state $S_z$ during a stage k relative to a log-likelihood of said encoding process arriving at another state $S_w$ during said stage k.

20. The non-transitory machine-readable medium of claim 19, further comprising instructions to cause the operation of computing said plurality of beta values $\beta'_{S,k}$ utilizing a plurality of previously computed beta values $\beta'_{S,k+1}$.

21. The non-transitory machine-readable medium of claim 20, further comprising instructions to cause the operation of computing each beta value of said plurality of beta values $\beta'_{S,k}$ utilizing at least one soft-decision value of said plurality of soft-decision values.

22. The non-transitory machine-readable medium of claim 19, further comprising instructions to cause the operation of performing an extrinsic computation by computing a plurality of probability values $p'_k$ utilizing said plurality of alpha values $\alpha'_{S,k+1}$ and said plurality of beta values $\beta'_{S,k}$, each probability value of said plurality of probability values $p'_k$ indicating a probability that a data bit of an input sequence $d_K$ had a value equal to zero or one, and said sequence $R(n)$ represents an encoded form of said input sequence $d_K$.

23. The non-transitory machine-readable medium of claim 22, further comprising instructions to cause the operation of determining a plurality of data bit values for each data bit of said input sequence $d_K$ utilizing said plurality of probability values $p'_k$, wherein each data bit value of said plurality of data bit values is a hard decision bit value.

* * * * *